(12) United States Patent
Oota et al.

(10) Patent No.: US 9,887,285 B1
(45) Date of Patent: Feb. 6, 2018

(54) SEMICONDUCTOR DEVICE

(71) Applicant: KABUSHIKI KAISHA TOSHIBA, Tokyo (JP)

(72) Inventors: Tsuyoshi Oota, Ibo Hyogo (JP); Masaru Furukawa, Himeji Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/444,238

(22) Filed: Feb. 27, 2017

(30) Foreign Application Priority Data

Sep. 21, 2016 (JP) .................................. 2016-184627

(51) Int. Cl.
| | |
|---|---|
| *H01L 29/78* | (2006.01) |
| *H01L 29/16* | (2006.01) |
| *H01L 29/06* | (2006.01) |
| *H01L 27/07* | (2006.01) |
| *H01L 29/10* | (2006.01) |

(52) U.S. Cl.
CPC ...... *H01L 29/7805* (2013.01); *H01L 27/0727* (2013.01); *H01L 29/0623* (2013.01); *H01L 29/0696* (2013.01); *H01L 29/1079* (2013.01); *H01L 29/1095* (2013.01); *H01L 29/1608* (2013.01); *H01L 29/7806* (2013.01)

(58) Field of Classification Search
USPC .......................................................... 257/77
See application file for complete search history.

(56) References Cited

U.S. PATENT DOCUMENTS

| | | | |
|---|---|---|---|
| 6,979,863 B2 | 12/2005 | Ryu | |
| 8,217,419 B2 | 7/2012 | Takaishi | |
| 9,252,211 B2 | 2/2016 | Uchida et al. | |
| 9,577,086 B2 | 2/2017 | Hino et al. | |
| 9,595,608 B2 * | 3/2017 | Kumagai | H01L 29/0684 |
| 2011/0204381 A1 * | 8/2011 | Okada | H01L 21/8252 257/76 |
| 2015/0021656 A1 * | 1/2015 | Kitagawa | H01L 29/0834 257/139 |

(Continued)

FOREIGN PATENT DOCUMENTS

| | | |
|---|---|---|
| JP | H08130249 A | 5/1996 |
| JP | 2008311453 A | 12/2008 |

(Continued)

*Primary Examiner* — Marcos D Pizarro
*Assistant Examiner* — Lawrence Tynes, Jr.
(74) *Attorney, Agent, or Firm* — Patterson & Sheridan, LLP

(57) ABSTRACT

A semiconductor device comprises a silicon carbide layer, a first electrode, a second electrode, and a gate. The silicon carbide layer has first region of first conductivity type between the first and second electrodes and also the gate and second electrode. A second region of the first type is between the first electrode and the first region. A third region of second conductivity type is between the first electrode and the second region. A fourth region of the first type is between the first electrode and the third region. A fifth region of the first type is between the gate and the second region. The third region is between the fourth and fifth regions. A sixth region of the first type contacts the first electrode and is between the second region and this electrode. An insulation layer is between the gate and the third region and also the fifth region.

20 Claims, 19 Drawing Sheets

(56) References Cited

U.S. PATENT DOCUMENTS

2016/0276468 A1\* 9/2016 Izumisawa .......... H01L 29/7395

FOREIGN PATENT DOCUMENTS

| JP | 2009194127 A | 8/2009 |
|----|---|---|
| JP | 2013069750 A | 4/2013 |
| JP | 5210518 B2 | 6/2013 |
| JP | 2016006854 A | 1/2016 |
| JP | 5940235 B1 | 6/2016 |
| JP | 5992094 B2 | 9/2016 |
| WO | 2016052261 A1 | 4/2016 |

\* cited by examiner

SEMICONDUCTOR DEVICE

CROSS-REFERENCE TO RELATED APPLICATION

This application is based upon and claims the benefit of priority from Japanese Patent Application No. 2016-184627, filed Sep. 21, 2016, the entire contents of which are incorporated herein by reference.

FIELD

Embodiments described herein relate generally to a semiconductor device.

BACKGROUND

Silicon carbide is considered a material for next-generation semiconductor devices. Silicon carbide has better physical properties than silicon in that its band gap is 3 times larger, its breakdown electric field intensity is about 10 times higher, and its thermal conductivity is about 3 times higher. When these characteristics are utilized, for example, metal oxide semiconductor field effect transistors (MOSFETs) capable of operating at higher breakdown voltage, at lower loss, and at higher temperature can be realized.

Vertical MOSFETs using silicon carbide have a pn junction diode as a body diode. For example, MOSFETs can be used as switching elements connected to inductive loads. In this case, even when the MOSFETs are nominally turned off, reflux currents can flow through the body diodes.

However, when reflux currents flow through the body diodes, stacking faults grow in silicon carbide layers due to charge carrier recombination, and thus there is a problem that on-state resistance of MOSFETs subsequently increases. The increase in the on-state resistance of MOSFETs results in a reduction in long-term reliability of MOSFETs.

DETAILED DESCRIPTION

Figure 1:
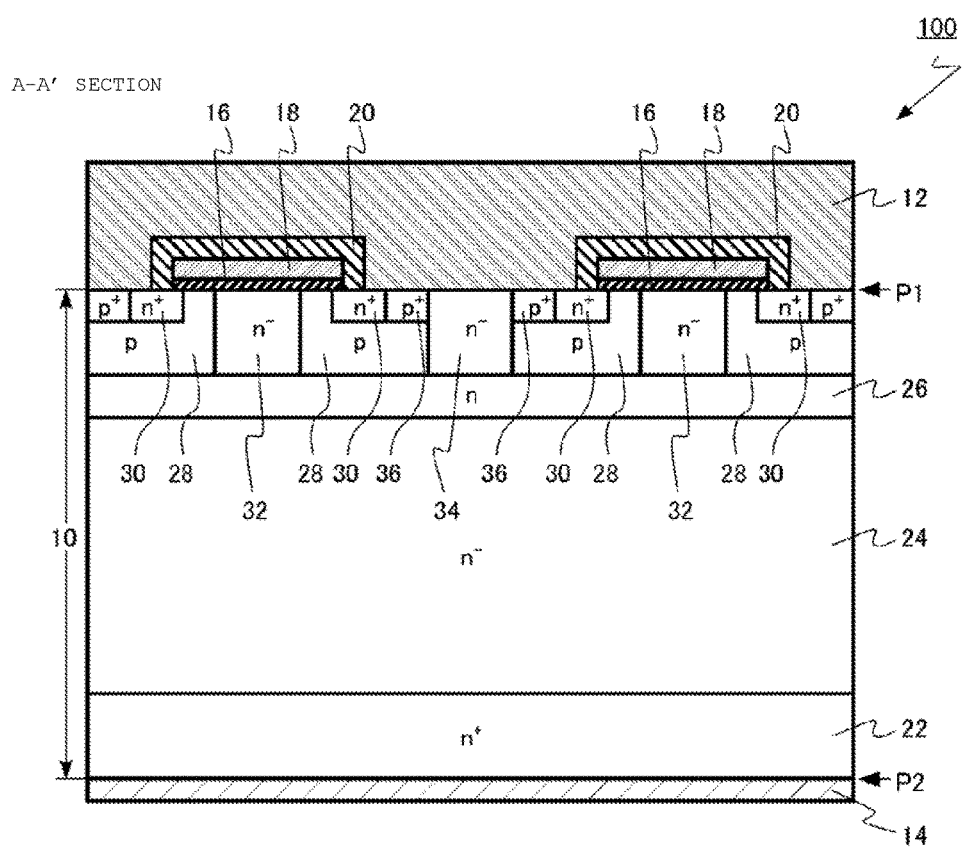
FIG. 1 is a schematic cross-sectional view of a semiconductor device according to a first embodiment.

In general, according to one embodiment, a semiconductor device comprises a silicon carbide layer, a first electrode on a first side of the silicon carbide layer, a second electrode on a second side of the silicon carbide layer, and a gate electrode between the first electrode and the silicon carbide layer. A first region of a first conductivity type is in the silicon carbide layer. The region is between the first electrode and the second electrode and also between the gate electrode and the second electrode. A second region of the first conductivity type is in the silicon carbide layer. The second region is between the first electrode and the first region and has an impurity concentration of the first conductivity type that is higher than an impurity concentration of the first conductivity type of the first region. A third region of a second conductivity type is in the silicon carbide layer. The third region is between the first electrode and the second region. A fourth region of the first conductivity type is in the silicon carbide layer. The fourth region is between the first electrode and the third region. A fifth region of the first conductivity type is in the silicon carbide layer. The fifth region is between the gate electrode and the second region. The third region is between the fourth region and the fifth region. A sixth region of the first conductivity type is in the silicon carbide layer. The sixth region is between the first electrode and the second region and contacts the first electrode. A gate insulation layer is between the gate electrode and the third region and also between the gate electrode and the fifth region.

Hereinafter, example embodiments will be described with reference to the drawings. In the following description, identical or similar elements are given the same reference symbols, and repeated aspects described once will not necessarily be described again.

In the following description, notation of $n^+$, n, $n^-$, and $p^+$, p, and $p^-$ indicate relative differences in impurity concentration for respective conductivity types. That is, $n^+$ indicates an n-type impurity concentration that is higher than n, and $n^-$ indicates an n-type impurity concentration that is lower than n. Similarly, $p^+$ indicates a p-type impurity concentration that is higher than p, and $p^-$ indicates a p-type impurity concentration that is lower than p. Furthermore, in some instances, $n^+$ and $n^-$ types may be simply described as an n-type region, and $p^+$ and $p^-$ types may be simply described as a p-type region.

An impurity concentration can be measured by, for example, a secondary ion mass spectrometry (SIMS). A relative difference in impurity concentration can also be determined by, for example, a scanning capacitance microscopy (SCM). In addition, a distance such as a depth or a thickness of an impurity region can be obtained by SIMS, for example. Moreover, a distance such as a depth, a thickness, a width, or a space of the impurity region can be obtained, for example, from a composite image of an SCM image and an AFM (Atomic Force Microscope) image.

First Embodiment

A semiconductor device according to this embodiment includes: a first electrode; a second electrode; a gate electrode; a first silicon carbide region of a first conductivity type that is at least partially provided between the first electrode and the second electrode and is at least partially provided between the gate electrode and the second electrode; a second silicon carbide region of the first conductivity type that is provided between the first electrode and the first silicon carbide region and has an impurity concentration of impurities of the first conductivity type higher than that of the first silicon carbide region; a third silicon carbide region of a second conductivity type that is provided between the first electrode and the second silicon carbide region; a fourth silicon carbide region of the first conductivity type that is provided between the first electrode and the third silicon carbide region; a fifth silicon carbide region of the first conductivity type that is provided between the gate electrode and the second silicon carbide region, the third silicon carbide region being located between the fourth silicon carbide region and the fifth silicon carbide region; a sixth silicon carbide region of the first conductivity type that is provided between the first electrode and the second silicon carbide region and is in contact with the first electrode; and a gate insulation layer that is provided between the gate electrode and the third silicon carbide region and between the gate electrode and the fifth silicon carbide region.

Figure 2:
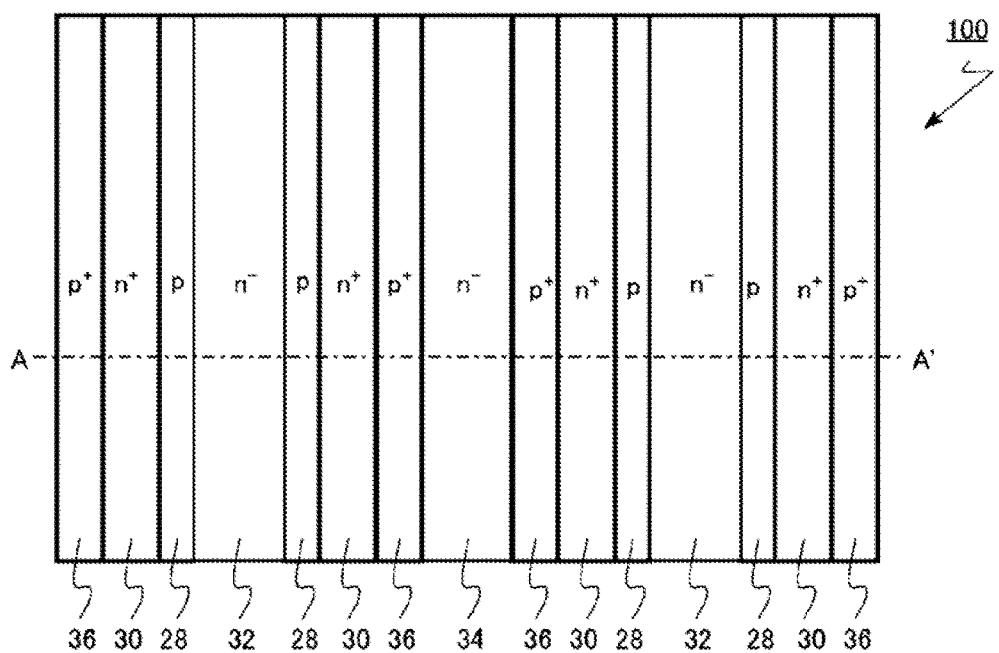
FIG. 2 is a schematic top view of the semiconductor device according to the first embodiment.
Figure 3:
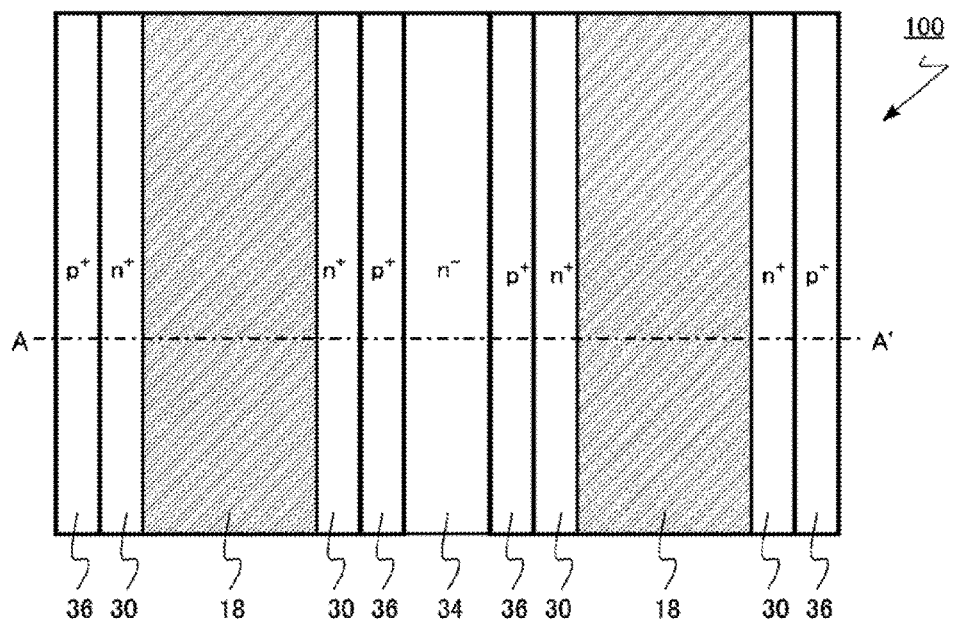
FIG. 3 is a schematic top view of the semiconductor device according to the first embodiment.

FIG. 1 is a schematic cross-sectional view of a semiconductor device according to this first embodiment. FIGS. 2 and 3 are schematic top views of the semiconductor device according to this first embodiment. FIG. 2 is a diagram illustrating impurity region patterns at an upper surface of a silicon carbide layer. FIG. 3 is a diagram in which gate electrode patterns are superimposed on the impurity region patterns illustrated in FIG. 2. FIG. 1 is a cross-sectional view taken along line A-A' in FIGS. 2 and 3.

The semiconductor device according to this first embodiment corresponds to a planar gate vertical MOSFET 100 formed using silicon carbide. The MOSFET 100 is, for example, a double implantation MOSFET (DIMOSFET) in which a body region and a source region are formed by ion implantation. In addition, the semiconductor device according to this first embodiment includes an SBD (Schottky Barrier Diode) as a built-in diode.

Hereinafter, a case where a first conductivity type is an n-type and a second conductivity type is a p-type will be described as an example. The MOSFET 100 is a vertical n-channel type MOSFET using electrons as a carrier.

The MOSFET 100 includes a silicon carbide layer 10, a source electrode 12 (first electrode), a drain electrode 14 (second electrode), a gate insulation layer 16, a gate electrode 18, and an interlayer insulating layer 20.

The silicon carbide layer 10 includes an n$^+$ type drain region 22, an n$^-$ type drift region 24 (first silicon carbide region), an n-type low resistance region 26 (second silicon carbide region), a p-type body region 28 (third silicon carbide region), an n$^+$ type source region 30 (fourth silicon carbide region), an n$^-$ type JFET region 32 (fifth silicon carbide region), an n$^-$ type SBD cathode region 34 (sixth silicon carbide region), and a p$^+$ type body contact region 36 (seventh silicon carbide region).

The silicon carbide layer 10 is at least partially provided between the source electrode 12 and the drain electrode 14. The silicon carbide layer 10 is also at least partially provided between the gate electrode 18 and the drain electrode 14. The silicon carbide layer 10 is formed of monocrystalline SiC. The silicon carbide layer 10 is formed of 4H—SiC, for example.

The silicon carbide layer 10 includes a first surface ("P1" in FIG. 1) and a second surface ("P2" in FIG. 1). Hereinafter, the first surface may also be referred to as a front surface, and the second surface may also be referred to as a rear surface. A "depth" described hereinafter means a distance from the first surface towards the second surface.

The first surface is, for example, a surface having an inclined angle of not less than 0° and not more than 8° relative to a (0001) plane. In addition, the second surface is, for example, a surface having an inclined angle of not less than 0° and not more than 8° relative to a (000-1) plane. The (0001) plane is referred to as a silicon plane. The (000-1) plane is referred to as a carbon plane.

The n$^+$ type drain region 22 is provided on the rear surface of the silicon carbide layer 10. The drain region 22 contains, for example, nitrogen (N) as an n-type impurity. An impurity concentration of the n-type impurities in the drain region 22 is not less than $1\times10^{18}$ cm$^{-3}$ and not more than $1\times10^{21}$ cm$^{-3}$, for example.

The n$^-$ type drift region 24 is at least partially between the source electrode 12 and the drain electrode 14. The n$^-$ type drift region 24 is also at least partially between the gate electrode 18 and the drain electrode 14.

The n$^-$ type drift region 24 is provided on the drain region 22. The drift region 24 contains, for example, nitrogen (N) as an n-type impurity. An impurity concentration of the n-type impurities in the drift region 24 is lower than the impurity concentration of the n-type impurities in the drain region 22. The impurity concentration of the n-type impurities in the drift region 24 is not less than $4\times10^{14}$ cm$^{-3}$ and not more than $1\times10^{17}$ cm$^{-3}$, for example. A thickness of the drift region 24 is, for example, 5 μm or more and 150 μm or less.

The n-type low resistance region 26 is provided on the drift region 24. The n-type low resistance region 26 is provided between the source electrode 12 and the drift region 24. The low resistance region 26 contains, for example, nitrogen (N) as an n-type impurity.

An impurity concentration of the n-type impurities in the low resistance region 26 is higher than the impurity concentration of the n-type impurities in the drift region 24. For example, the impurity concentration of the n-type impurities in the low resistance region 26 is at least twice as high as the impurity concentration of the n-type impurities in the drift region 24.

The impurity concentration of the n-type impurities in the low resistance region 26 is, for example, not less than $8\times10^{14}$ cm$^{-3}$ and not more than $2\times10^{17}$ cm$^{-3}$. A thickness of the low resistance region 26 is, for example, 0.5 μm or more and 5 μm or less.

The p-type body region 28 is provided between the source electrode 12 and the low resistance region 26. The body region 28 functions as a channel region of the MOSFET 100.

The body region 28 contains, for example, aluminum (Al) as a p-type impurity. An impurity concentration of the p-type impurities in the body region 28 is, for example, not less than $1\times10^{17}$ cm$^{-3}$ and not more than $5\times10^{17}$ cm$^{-3}$.

A depth of the body region 28 is, for example, about 0.3 μm to about 0.8 μm.

The body region 28 is fixed to the potential of the source electrode 12. The body region 28 is fixed to a ground potential, for example.

The source region 30 is provided between the source electrode 12 and the body region 28. The source region contains, for example, phosphorus (P) as an n-type impurity. An impurity concentration of the n-type impurities in the source region 30 is higher than the impurity concentration of the n-type impurities in the drift region 24.

The impurity concentration of the n-type impurities in the source region 30 is, for example, not less than $1 \times 10^{19}$ cm$^{-3}$ and not more than $1 \times 10^{21}$ cm$^{-3}$. A depth of the source region 30 is shallower than the depth of the body region 28 and is, for example about 0.1 μm to about 0.3 μm.

The source region 30 is fixed to the potential of the source electrode 12. For example, the source region 30 is fixed to the ground potential.

Here, the p$^+$ type body contact region 36 is between the source electrode 12 and the body region 28 in a vertical direction and between the source region 30 and the SBD cathode region 34 in a horizontal direction.

An impurity concentration of the p-type impurities in the body contact region 36 is higher than the impurity concentration of the p-type impurities in the body region 28.

The body contact region 36 contains, for example, aluminum (Al) as a p-type impurity. The impurity concentration of the p-type impurities in the body contact region 36 is, for example, not less than $1 \times 10^{19}$ cm$^{-3}$ and not more than $1 \times 10^{21}$ cm$^{-3}$.

A depth of the body contact region 36 is, for example, about 0.3 μm to 0.6 μm.

The n$^-$ type JFET region 32 is between the gate electrode 18 and the low resistance region 26 in a vertical direction. The body region 28 is between the JFET region 32 and the source region 30 in a horizontal direction.

When the MOSFET 100 is in the on state, electron current flows to the drain electrode 14 from the source electrode 12 through the source region 30, a channel formed in the body region 28, the JFET region 32, the low resistance region 26, the drift region 24, and the drain region 22.

The JFET region 32 contains, for example, nitrogen (N) as an n-type impurity. An impurity concentration of the n-type impurities in the JFET region 32 is higher than the impurity concentration of the n-type impurities in the drift region 24, for example. The impurity concentration of the n-type impurities in the JFET region 32 is, for example, at least twice the impurity concentration of the n-type impurities in the drift region 24.

For example, the impurity concentration of the n-type impurities in the JFET region 32 is not less than $8 \times 10^{14}$ cm$^{-3}$ and not more than $2 \times 10^{17}$ cm$^{-3}$.

The n$^-$ type SBD cathode region 34 is between the upper surface (P1) of the silicon carbide layer 10 and the low resistance region 26. The SBD cathode region 34 is in contact with the source electrode 12.

The SBD cathode region 34 forms an SBD together with the source electrode 12. The source electrode 12 functions as an anode of the SBD, and the SBD cathode region 34 functions as a cathode of the SBD.

The SBD cathode region 34 contains, for example, nitrogen (N) as an n-type impurity. An impurity concentration of the n-type impurities in the SBD cathode region 34 is higher than the impurity concentration of the n-type impurities in the drift region 24, for example. The impurity concentration of the n-type impurities in the SBD cathode region 34 is, for example, twice or more as high as the impurity concentration of the n-type impurities in the drift region 24.

For example, the impurity concentration of the n-type impurities in the SBD cathode region 34 is higher than the impurity concentration of the n-type impurities in the JFET region 32. The impurity concentration of the n-type impurities in the SBD cathode region 34 is, for example, at least twice the impurity concentration of the n-type impurities in the JFET region 32.

The gate electrode 18 is a conductive layer. The gate electrode 18 is made of polycrystalline silicon including the p-type impurity or the n-type impurity, for example.

The gate insulation layer 16 is between the gate electrode 18 and the body region 28. In addition, the gate insulation layer 16 is between the gate electrode 18 and the JFET region 32. Furthermore, the gate insulation layer 16 is between the gate electrode 18 and the source region 30.

For example, the gate insulation layer 16 is made of silicon oxide. For the gate insulation layer 16, for example, a High-k insulating material (high dielectric constant insulating material) can be used.

The interlayer insulating layer 20 is provided on the gate electrode 18. The interlayer insulating layer 20 is made of, for example, silicon oxide.

The source electrode 12 is in contact with the source region 30. The source electrode 12 may also be in contact with the body contact region 36.

The source electrode 12 contains a metal. The metal forming the source electrode 12 can have a stacked structure of titanium (Ti) and aluminum (Al), for example. A region of the source electrode 12 that is in contact with the silicon carbide layer 10 can be made of, for example, a metal silicide. An example of a metal silicide includes titanium silicide and nickel silicide.

The drain electrode 14 is provided on the rear surface of the silicon carbide layer 10. The drain electrode 14 is in contact with the drain region 22.

The drain electrode 14 is made of, for example, a metal or a metal-semiconductor compound. For example, the drain electrode 14 comprises a material selected from the group consisting of nickel silicide, titanium (Ti), nickel (Ni), silver (Ag), and gold (Au).

Operations and effects of the MOSFET 100 will be described below.

Figure 4:
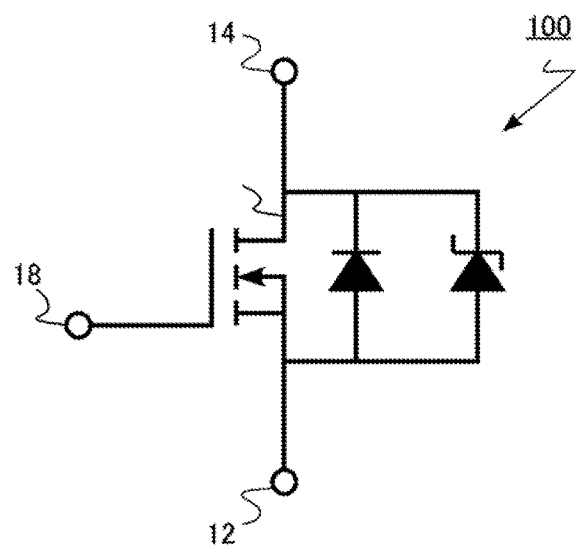
FIG. 4 is an equivalent circuit diagram of the semiconductor device according to the first embodiment.

FIG. 4 is an equivalent circuit diagram of the semiconductor device according to this first embodiment. Between the source electrode 12 and the drain electrode 14, a pn diode and an SBD are connected in parallel with a transistor. Here, the pn diode and the SBD diode pair act as a built-in diode. The body region 28 functions as an anode of the pn junction diode, and the drift region 24 functions as a cathode of the pn junction diode. The source electrode 12 functions as an anode of the SBD, and the SBD cathode region 34 functions as a cathode of the SBD.

For example, a case is considered in which the MOSFET 100 is used as a switching element connected to an inductive load. When the MOSFET 100 is turned off, a voltage which is positive with respect to the drain electrode 14 may be applied to the source electrode 12 by a load current generated by the inductive load. In this case, a forward current flows through the built-in diode. This state may be referred to as a reverse conductive state.

A forward voltage (Vf) at which a forward current starts flowing in the SBD is typically lower than a forward voltage (Vf) of the pn junction diode. Accordingly, the forward current flows only through the SBD at first.

The forward voltage (Vf) of the SBD is, for example, 1.0 V. The forward voltage (Vf) of the pn junction diode is, for example, 2.5 V.

The SBD operates as a unipolar device. Therefore, no stacking fault due to carrier recombination grows in the silicon carbide layer 10 even though the forward current flows.

After the forward current has already started flowing through the SBD, the forward current may begin to flow through the pn junction diode as well once the voltage across the pn junction diode exceeds the forward voltage (Vf) of the pn junction diode. The pn junction diode operates a bipolar device.

A small number of carriers are injected into the drift region 24 from the body region 28. For this reason, a stacking fault grows in the silicon carbide layer 10 due to carrier recombination energy. Accordingly, an on-state resistance of the MOSFET 100 subsequently increases and this can cause a problem.

Figure 5:
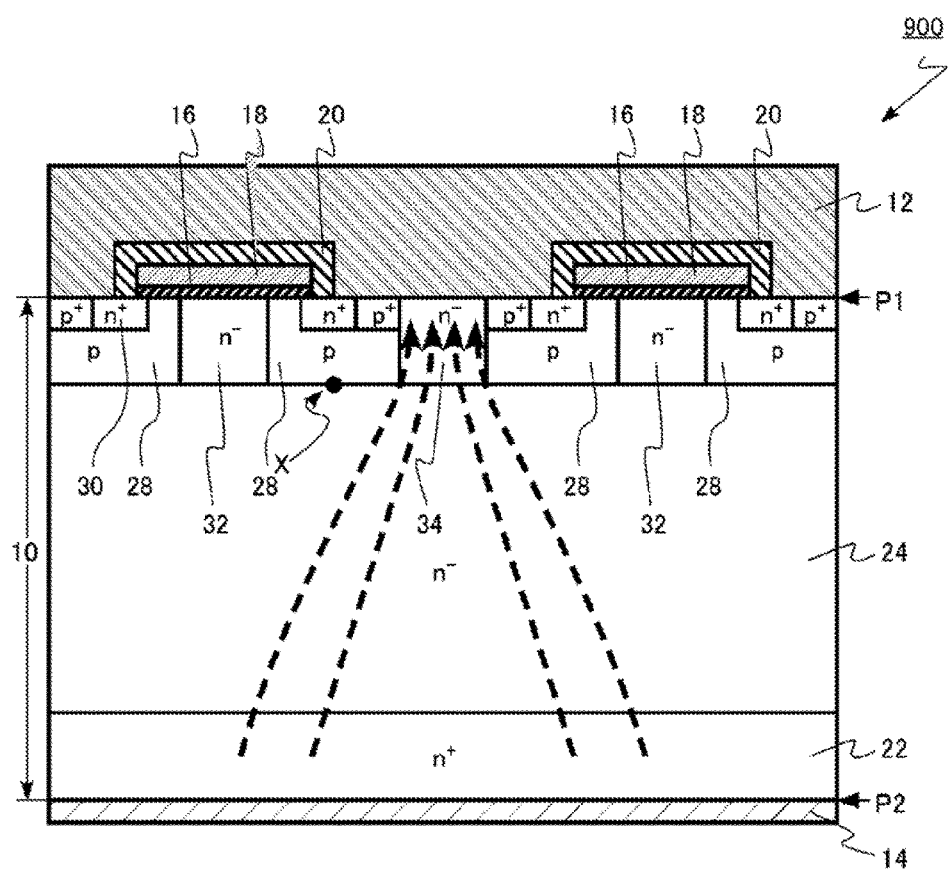
FIG. 5 is a diagram for explaining aspects of a semiconductor device according to a comparative example.

FIG. 5 is a diagram explaining the operations and effects of the semiconductor device according to a comparative example. FIG. 5 is a schematic cross-sectional view of an MOSFET 900 according to a comparative example. This cross-section in FIG. 5 corresponds, in general, to the cross-section illustrated in FIG. 1 excepting for the absence of the low resistance region 26 in FIG. 5.

FIG. 5 illustrates a path of a current flowing in a built-in diode of the MOSFET 900. The MOSFET 900 differs from the MOSFET 100 in that the low resistance region 26 has not been provided.

In FIG. 5, a state in which the forward current has started flowing in the SBD is indicated by dotted arrows representing current flow. When the voltage applied to the pn junction of the pn junction diode exceeds the forward voltage (Vf) of the pn junction diode, forward current also flows through the pn junction diode. That is, when the voltage applied between the body region 28 and the drift region 24 exceeds the forward voltage (Vf) of the pn junction diode, the forward current flows through the pn junction diode.

In the comparative example, a density of the electron current flowing through a bottom of the body region 28, for example, in the vicinity of a point X in FIG. 5 is low. For this reason, the voltage drop is small in the drift region 24 at the bottom of the body region 28 because very little of the electron current is flowing through the drift region 24 proximate to the bottom of the body region 28.

Therefore, at the point X, the voltage applied between the body region 28 and the drift region 24 does not drop substantially. Accordingly, the voltage applied between the body region 28 and the drift region 24 might exceed the forward voltage (Vf) of the pn junction diode at the point X.

Figure 6:
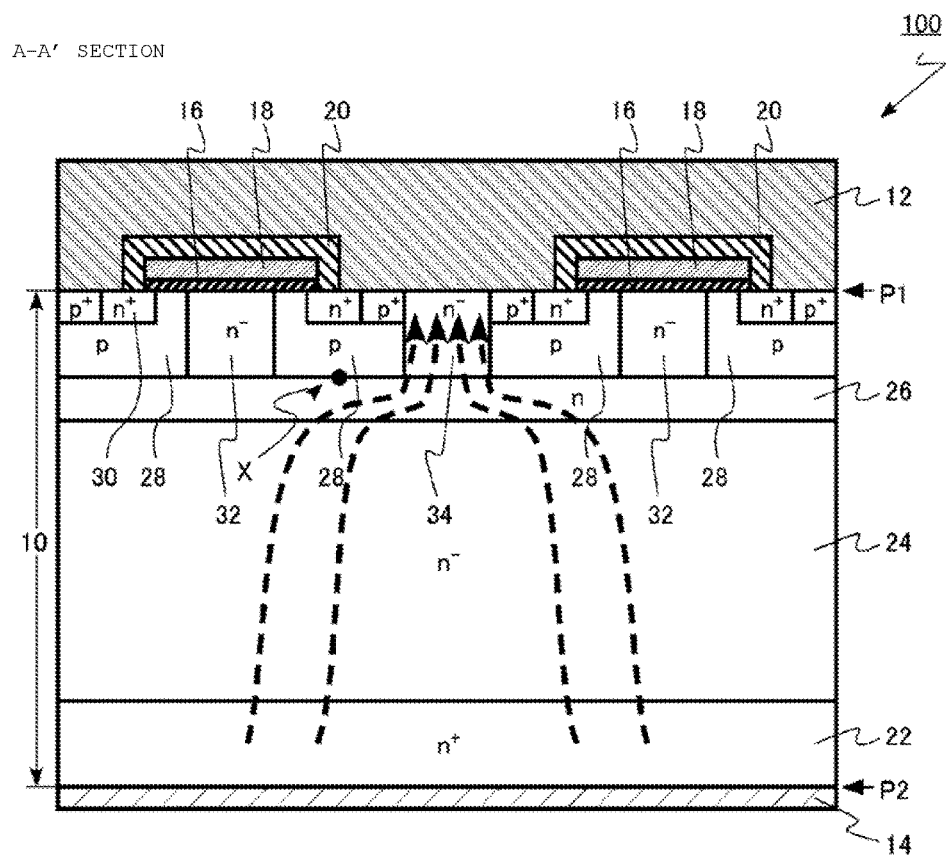
FIG. 6 is a diagram explaining aspects of the semiconductor device according to the first embodiment.

FIG. 6 is a diagram explaining the operations and effects of the semiconductor device according to this embodiment. FIG. 6 is a diagram illustrating a path of a current flowing in the built-in diode of the MOSFET 100. In FIG. 6, the flow of the electron current in a state in which the forward current has started flowing in the SBD is indicated by dotted arrows representing current flow.

The MOSFET 100 includes the low resistance region 26 having an electric resistance that is lower than that of the drift region 24. For this reason, a density of the electron current flowing in the vicinity of a point X in FIG. 6 becomes high. The voltage drop due to the entering of the electrostatic potential becomes large in the low resistance region 26 near the bottom of the body region 28.

Therefore, at the point X, the voltage applied between the body region 28 and the low resistance region 26 drops substantially more than in the comparative example. Accordingly, the voltage applied between the body region 28 and the drift region 26 at the point X is less apt to exceed the forward voltage (Vf) of the pn junction diode, and the forward operation of the pn junction diode will not occur, or will occur less frequently.

According to the MOSFET 100, the forward current is unlikely to flow through the pn junction diode, which operates in a bipolar manner. Therefore, it is possible to prevent the growth of the stacking fault in the silicon carbide layer 10 due to carrier recombination.

From the viewpoint of preventing the occurrence of the forward operation of the pn junction diode, it is desirable that the impurity concentration of the n-type impurities in the SBD cathode region 34 be higher than the impurity concentration of the n-type impurities in the drift region 24. When the impurity concentration of the n-type impurities in the SBD cathode region 34 becomes higher, the voltage drop due to the electron current increases in the low resistance region 26 at the bottom of the body region 28.

On the other hand, when the impurity concentration of the n-type impurities in the SBD cathode region 34 becomes too high, a Schottky barrier of the SBD may decrease and the breakdown voltage of the SBD may drop. Accordingly, it is desirable that the impurity concentration of the n-type impurities in the SBD cathode region 34 be lower than the impurity concentration of the n-type impurities in the low resistance region 26.

From the viewpoint of increasing an ON-current of the MOSFET 100, it is desirable for a resistance of the JFET region 32 to be low. Accordingly, it is desirable that the impurity concentration of the n-type impurities in the JFET region 32 be higher than the impurity concentration of the n-type impurities in the drift region 24.

On the other hand, when the impurity concentration of the n-type impurities in the JFET region 32 becomes too high, there are concerns that when turning-off of the MOSFET 100 that the JFET region 32 will not be depleted, electric field strength in the gate insulation layer 16 will increase, and reliability of the gate insulation layer 16 will be reduced. Accordingly, it is desirable that the impurity concentration of the n-type impurities in the JFET region 32 be lower than the impurity concentration of the n-type impurities in the low resistance region 26.

The upper limit of the impurity concentration of the n-type impurities in the SBD cathode region 34 has a wider margin than the upper limit of the impurity concentration of the n-type impurities in the JFET region 32. Therefore, it is desirable that the impurity concentration of the n-type impurities in the SBD cathode region 34 be higher than the impurity concentration of the n-type impurities in the JFET region 32.

As described above, according to this first embodiment, the pn junction diode built in the MOSFET 100 hardly operates in a forward manner. Accordingly, a MOSFET 100 is achieved in which the growth of the stacking fault in the silicon carbide layer 10 can be prevented and reliability can be improved.

Second Embodiment

A semiconductor device according to this embodiment includes: a first electrode; a second electrode; a gate electrode; a first silicon carbide region of a first conductivity type that is at least partially provided between the first electrode and the second electrode and is at least partially provided between the gate electrode and the second electrode; a second silicon carbide region of the first conductivity type that is provided between the first electrode and the first silicon carbide region and is in contact with the first electrode; a third silicon carbide region of the first conductivity type that is provided between the first electrode and the first silicon carbide region and is in contact with the first electrode; a fourth silicon carbide region of the first conductivity type that is provided between the first electrode and the first silicon carbide region and is in contact with the first electrode; a fifth silicon carbide region of the first conductivity type that is provided between the first electrode and the first silicon carbide region and is in contact with the first electrode; a sixth silicon carbide region of a second conductivity type that is provided between the first electrode and the first silicon carbide region, and is located between the second silicon carbide region and the fourth silicon carbide region and between the third silicon carbide region and the fifth silicon carbide region; a seventh silicon carbide region of the first conductivity type that is provided between the first electrode and the sixth silicon carbide region; and a gate insulation layer that is provided between the gate electrode and the first silicon carbide region and between the gate electrode and the sixth silicon carbide region.

The semiconductor device according to this second embodiment differs from the semiconductor device according to the first embodiment in that a layout pattern is provided in which octagon-based units are repeatedly arranged.

Figure 7:
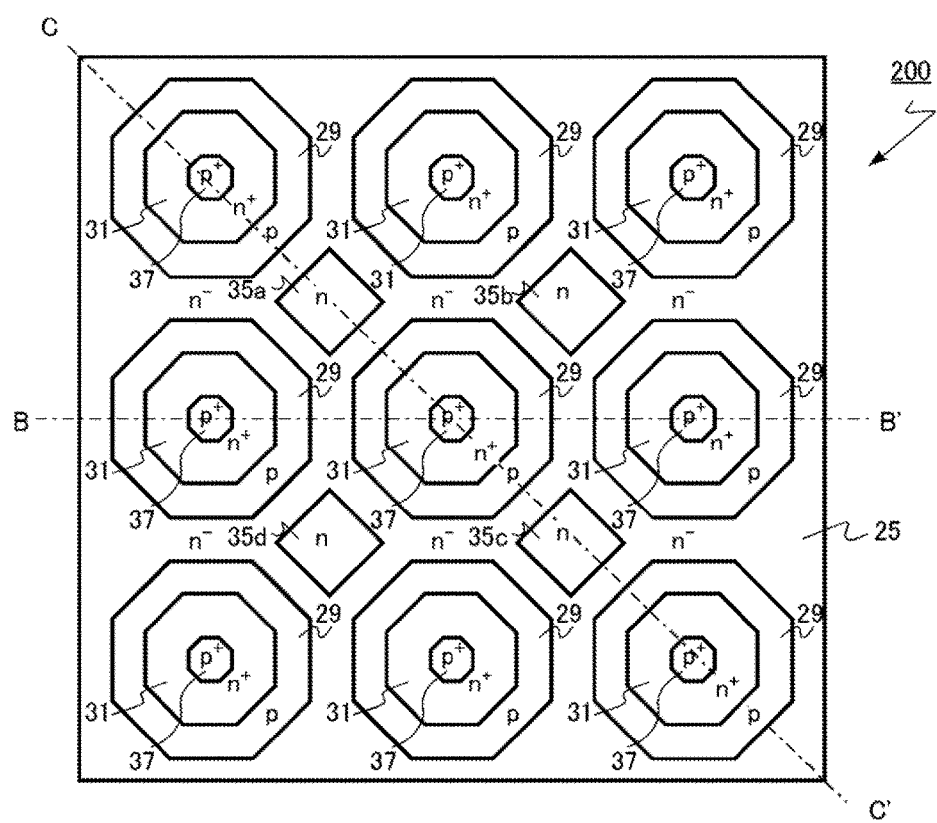
FIG. 7 is a schematic top view of a semiconductor device according to a second embodiment.
Figure 8:
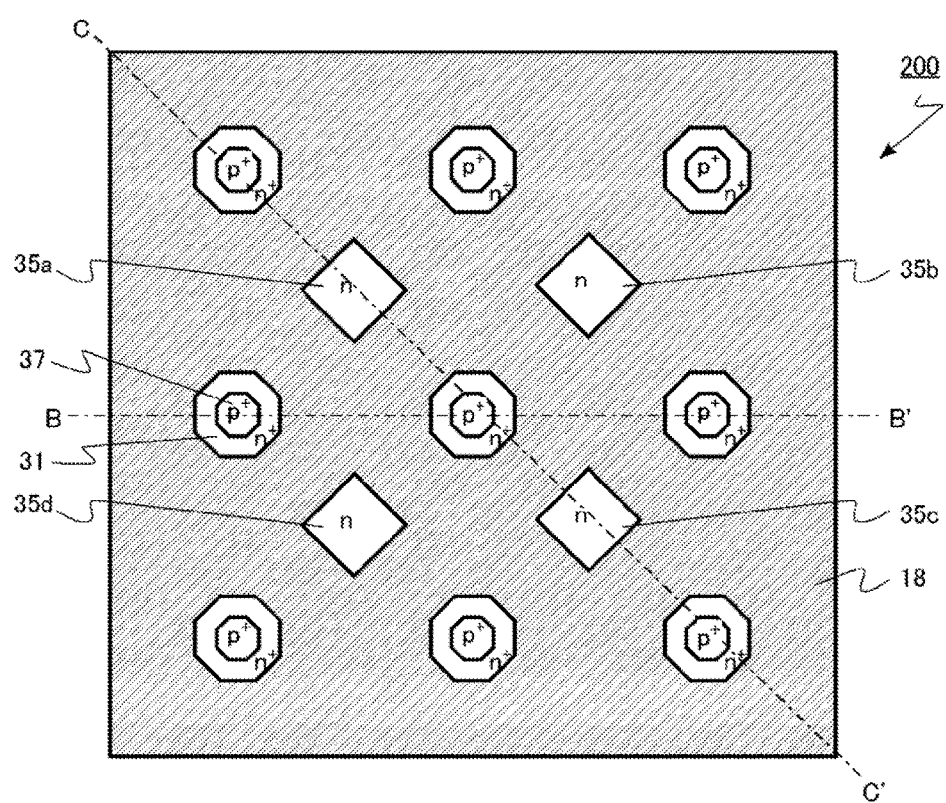
FIG. 8 is a schematic top view of the semiconductor device according to the second embodiment.
Figure 9:
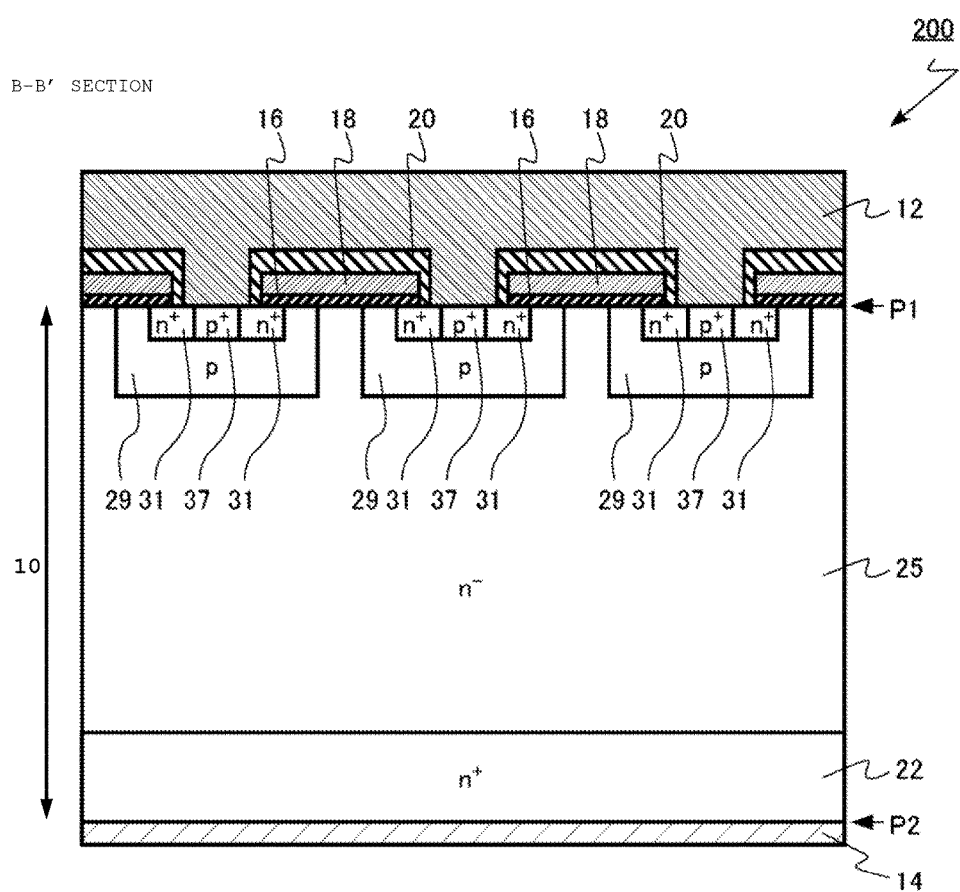
FIG. 9 is a schematic cross-sectional view of the semiconductor device according to the second embodiment.
Figure 10:
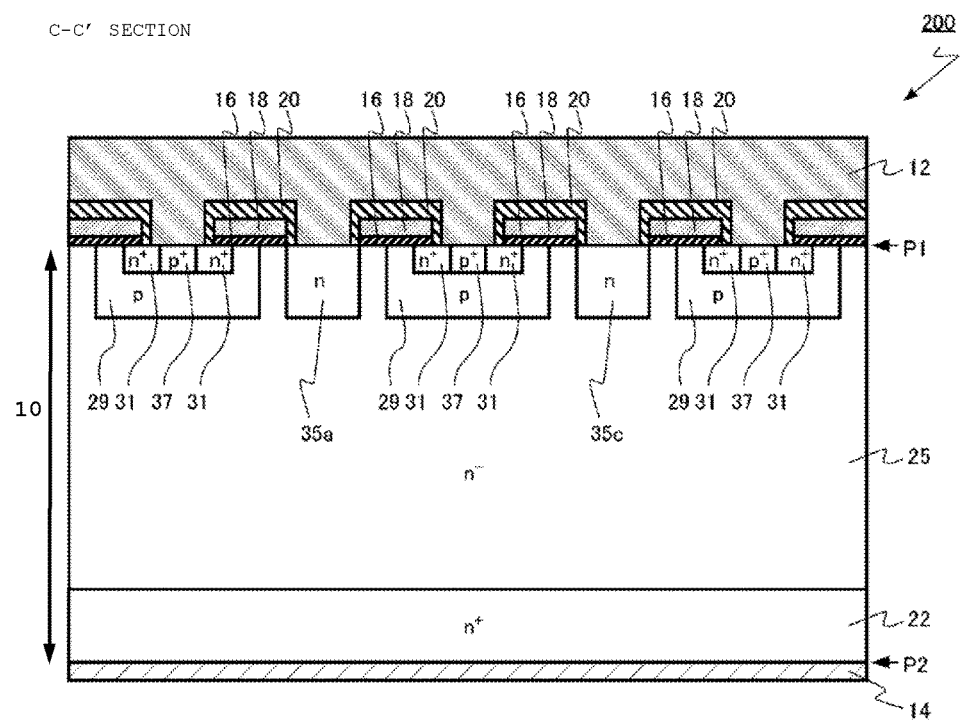
FIG. 10 is a schematic cross-sectional view of the semiconductor device according to the second embodiment.

FIGS. 7 and 8 are schematic top views of the semiconductor device according to this second embodiment. FIGS. 9 and 10 are schematic cross-sectional views of the semiconductor device according to this second embodiment. FIG. 7 is a diagram illustrating impurity region patterns on a surface of the silicon carbide layer. FIG. 8 is a diagram in which gate electrode patterns are superimposed on the impurity region patterns illustrated in FIG. 7. FIG. 9 is a cross-sectional view taken along line B-B' in FIGS. 7 and 8. FIG. 10 is a cross-sectional view taken along line C-C' in FIGS. 7 and 8.

The semiconductor device according to this second embodiment is a planar gate type vertical MOSFET 200 formed in silicon carbide. The MOSFET 200 is, for example, a double implantation MOSFET in which a body region and a source region are formed by ion implantation. In addition, the semiconductor device according to this second embodiment includes an SBD as a built-in diode.

Hereinafter, a case where a first conductivity type is an n-type and a second conductivity type is a p-type will be described as an example. The MOSFET 200 is a vertical n-channel type MOSFET using electrons as a carrier.

The MOSFET 200 includes a silicon carbide layer 10, a source electrode 12 (first electrode), a drain electrode 14 (second electrode), a gate insulation layer 16, a gate electrode 18, and an interlayer insulating layer 20.

The silicon carbide layer 10 includes an n$^+$ type drain region 22, an n$^-$ type drift region 25 (first silicon carbide region), a p-type body region 29 (sixth silicon carbide region), an n$^+$ type source region 31 (seventh silicon carbide region), an n-type first SBD cathode region 35*a* (second silicon carbide region), an n-type second SBD cathode region 35*b* (third silicon carbide region), an n-type third SBD cathode region 35*c* (fourth silicon carbide region), an n-type fourth SBD cathode region 35*d* (fifth silicon carbide region), and a p$^+$ type body contact region 37 (eighth silicon carbide region).

The silicon carbide layer 10 is between the source electrode 12 and the drain electrode 14. The silicon carbide layer 10 is also between the gate electrode 18 and the drain electrode 14. The silicon carbide layer 10 is formed of monocrystalline SiC. The silicon carbide layer 10 has a structure of 4H—SiC, for example.

The silicon carbide layer 10 includes a first surface ("P1" in FIG. 9) and a second surface ("P2" in FIG. 9).

The first surface is, for example, a surface having an inclined angle of not less than 0° and not more than 8° relative to a (0001) plane. In addition, the second surface is, for example, a surface having an inclined angle of not less than 0° and not more than 8° relative to a (000-1) plane. The (0001) plane is referred to as a silicon plane. The (000-1) plane is referred to as a carbon plane.

The n$^+$ type drain region 22 is provided on the rear surface of the silicon carbide layer 10. The drain region 22 contains, for example, nitrogen (N) as an n-type impurity. An impurity concentration of the n-type impurities in the drain region 22 is not less than $1\times10^{18}$ cm$^{-3}$ and not more than $1\times10^{21}$ cm$^{-3}$, for example.

The n$^-$ type drift region 25 is between the source electrode 12 and the drain electrode 14. The n$^-$ type drift region 25 is also between the gate electrode 18 and the drain electrode 14.

The n$^-$ type drift region 25 is provided on the drain region 22. The drift region 25 contains, for example, nitrogen (N) as an n-type impurity. An impurity concentration of the n-type impurities in the drift region 25 is lower than the impurity concentration of the n-type impurities in the drain region 22. The impurity concentration of the n-type impurities in the drift region 25 is not less than $4\times10^{14}$ cm$^{-3}$ and not more than $1\times10^{17}$ cm$^{-3}$, for example. A thickness of the drift region 25 is, for example, not less than 5 µm and not more than 150 µm.

The p-type body region 29 is provided between the source electrode 12 and the drift region 25 in a vertical direction. The body region 29 is located between the first SBD cathode region 35*a* and the third SBD cathode region 35*c* (see FIG. 7) in a horizontal direction. The body region 29 is located between the second SBD cathode region 35*b* and the fourth SBD cathode region 35*d* in a horizontal direction (see FIG. 7). The first SBD cathode region 35*a*, the second SBD cathode region 35*b*, the third SBD cathode region 35*c*, and the fourth SBD cathode region 35*d* are arrayed around the body region 29.

The body region 29 has an octagonal pattern. The body region 29 functions as a channel region of the MOSFET 200.

The body region 29 contains, for example, aluminum (Al) as a p-type impurity. An impurity concentration of the p-type impurities in the body region 29 is, for example, not less than $1\times10^{17}$ cm$^{-3}$ and not more than $5\times10^{17}$ cm$^{-3}$.

A depth of the body region 29 is, for example, about 0.3 µm to about 0.8 µm.

The body region 29 is fixed to the potential of the source electrode 12. The body region 29 is fixed to a ground potential, for example.

The source region 31 is provided between the source electrode 12 and the body region 29. The source region 31 is provided in the body region 29. The source region 31 is surrounded by the body region 29 within a horizontal plane.

The source region 31 contains, for example, phosphorus (P) as an n-type impurity. An impurity concentration of the n-type impurities in the source region 31 is higher than the impurity concentration of the n-type impurities in the drift region 25.

The impurity concentration of the n-type impurities in the source region 31 is, for example, not less than $1\times10^{19}$ cm$^{-3}$ and not more than $1\times10^{21}$ cm$^{-3}$. A depth of the source region 31 is shallower than the depth of the body region 29, and is, for example, about 0.1 μm to about 0.3 μm.

The source region 31 is fixed to the potential of the source electrode 12. For example, the source region 31 is fixed to the ground potential.

The p+ type body contact region 37 is provided between the source electrode 12 and the body region 29. The body contact region 37 is provided in the body region 29. The body contact region 37 is surrounded by the source region 31 within a horizontal plane.

An impurity concentration of the p-type impurities in the body contact region 37 is higher than the impurity concentration of the p-type impurities in the body region 29.

The body contact region 37 contains, for example, aluminum (Al) as a p-type impurity. The impurity concentration of the p-type impurities in the body contact region 37 is, for example, not less than $1 \times 10^{19}$ cm$^{-3}$ and not more than $1 \times 10^{21}$ cm$^{-3}$.

A depth of the body contact region 37 is, for example, about 0.3 μm to about 0.6 μm.

The n-type first SBD cathode region 35a, the n-type second SBD cathode region 35b, the n-type third SBD cathode region 35c, and the n-type fourth SBD cathode region 35d are provided between an upper surface (P1) of the silicon carbide layer and the drift region 25. The first SBD cathode region 35a, the second SBD cathode region 35b, the third SBD cathode region 35c, and the fourth SBD cathode region 35d are in contact with the source electrode 12.

The first SBD cathode region 35a, the second SBD cathode region 35b, the third SBD cathode region 35c, and the fourth SBD cathode region 35d form an SBD in conjunction with the source electrode 12. The source electrode 12 functions as the anode of the SBD, and the first SBD cathode region 35a, the second SBD cathode region 35b, the third SBD cathode region 35c, and the fourth SBD cathode region 35d function as the cathode of the SBD.

The first SBD cathode region 35a, the second SBD cathode region 35b, the third SBD cathode region 35c, and the fourth SBD cathode region 35d contain, for example, nitrogen (N) as an n-type impurity. Impurity concentrations of the n-type impurities in the first SBD cathode region 35a, the second SBD cathode region 35b, the third SBD cathode region 35c, and the fourth SBD cathode region 35d are higher than the impurity concentration of the n-type impurities in the drift region 25, for example. The impurity concentrations of the n-type impurities in the first SBD cathode region 35a, the second SBD cathode region 35b, the third SBD cathode region 35c, and the fourth SBD cathode region 35d are, for example, at least twice the impurity concentration of the n-type impurities in the drift region 25.

The gate electrode 18 is a conductive layer. The gate electrode 18 is made of polycrystalline silicon including the p-type impurity or the n-type impurity, for example.

The gate insulation layer 16 is between the gate electrode 18 and the drift region 25. In addition, the gate insulation layer 16 is between the gate electrode 18 and the body region 29. The gate insulation layer 16 is also between the gate electrode 18 and the source region 31.

The gate insulation layer 16 is provided between (i) the gate electrode 18 and (ii) the drift region 25, the body region 29 and the source region 31.

For example, the gate insulation layer 16 is made of silicon oxide. For the gate insulation layer 16, for example, a High-k insulating material (high dielectric constant insulating material) can be used.

The interlayer insulating layer 20 is provided on the gate electrode 18. The interlayer insulating layer 20 is made of, for example, silicon oxide.

The source electrode 12 is in contact with the source region 31. The source electrode 12 is in contact with the body contact region 37.

The source electrode 12 is formed of a metal. The metal forming the source electrode 12 may have a stacked structure of titanium (Ti) and aluminum (Al), for example. The region of the source electrode 12 contacting the silicon carbide layer 10 is made of, for example, metal silicide. An example of a metal silicide includes titanium silicide and nickel silicide.

The drain electrode 14 is provided on the rear surface of the silicon carbide layer 10. The drain electrode 14 is in contact with the drain region 22.

The drain electrode 14 is made of, for example, a metal or a metal semiconductor compound. For example, the drain electrode 14 comprises a material selected from the group consisting of nickel silicide, titanium (Ti), nickel (Ni), silver (Ag), and gold (Au).

Operations and effects of the MOSFET 200 will be described below.

Similarly to the MOSFET 100, MOSFET 200 is configured such that a pn diode and an SBD are connected in parallel with a transistor, between the source electrode 12 and the drain electrode 14 and the pair functions as a built-in diode of the transistor. The body region 29 functions as an anode of the pn junction diode, and the drift region 25 functions as a cathode of the pn junction diode. In addition, the source electrode functions as an anode of the SBD, and the first to fourth SBD cathode regions 35a, 35b, 35c, and 35d function as a cathode of the SBD.

For example, a case is considered in which the MOSFET 200 is used as a switching element connected to an inductive load. When the MOSFET 200 is turned off, a voltage which is positive with respect to the drain electrode 14 may be applied to the source electrode 12 by a load current generated by the inductive load. In such a case, a forward current may flow through the built-in diode.

A forward voltage (Vf) at which a forward current starts flowing to the SBD is typically lower than a forward voltage (Vf) of the pn junction diode. Accordingly, the forward current begins to flow through the SBD first.

The forward voltage (Vf) of the SBD is, for example, 1.0 V. The forward voltage (Vf) of the pn junction diode is, for example, 2.5 V.

The SBD performs unipolar operation. Therefore, no stacking fault due to carrier recombination energy grows in the silicon carbide layer 10 even when the forward current flows.

After the forward current starts flowing in the SBD, the forward current may begin to flow through the pn junction diode if a voltage applied across the pn junction of the pn junction diode exceeds the forward voltage (Vf) of the pn junction diode. However, the pn junction diode performs bipolar operation. Therefore, a stacking fault grows in the silicon carbide layer 10 due to carrier recombination. In this case, an on-state resistance of the MOSFET subsequently increases, possibly resulting in a problem.

In MOSFET 200, four SBDs are arranged around one body region 29. Accordingly, the electron current flows into the four SBDs arranged around the body region 29, and thus a density of the electron current flowing through the bottom of the body region 29 increases. Therefore, the voltage drop increases in the drift region 25 at the bottom of the body region 29.

Therefore, at the bottom of the body region 29, the voltage between the body region 29 and the drift region 25 drops. Accordingly, the voltage applied between the body region 29 and the drift region 25 is unlikely to exceed the forward voltage (Vf) of the pn junction diode at the bottom of the body region 29, and forward operation of the pn junction diode will not occur or will be less likely to occur.

According to this second embodiment, the forward current rarely flows through the pn junction diode, which performs the bipolar operation. Therefore, it is possible to prevent the growth of the stacking fault in the silicon carbide layer 10 caused by carrier recombination.

According to the MOSFET 200, the entire surface of the octagonal body region 29 functions as a channel region. Accordingly, it is possible to prevent the decrease in on-state resistance per unit area by the arrangement of the SBDs. Thus, the MOSFET 200 having a low on-state resistance is realized.

When it is necessary to increase a ratio of an occupied area of the SBDs to prevent the forward operation of the pn junction diode, it is possible to increase the ratio of the occupied area of the SBDs by, for example, reducing a size of the octagonal body region 29. Conversely, when it is necessary to reduce the ratio of the occupied area of the SBDs to increase an ON-state current flow, it is possible to reduce the ratio of the occupied area of the SBDs by, for example, enlarging the size of the octagonal body region 29.

From the viewpoint of preventing forward operation of the pn junction diode, it is desirable that the impurity concentrations of the n-type impurities in the first SBD cathode region 35a, the second SBD cathode region 35b, the third SBD cathode region 35c, and the fourth SBD cathode region 35d be higher than the impurity concentration of the n-type impurities in the drift region 25. When the impurity concentrations of the n-type impurities in the first SBD cathode region 35a, the second SBD cathode region 35b, the third SBD cathode region 35c, and the fourth SBD cathode region 35d become higher, the voltage drop due to the electron current increases in the drift region 25 at the bottom of the body region 29.

The first SBD cathode region 35a, the second SBD cathode region 35b, the third SBD cathode region 35c, and the fourth SBD cathode region 35d may be in contact with the body region 29. In this case, the on-state resistance of the MOSFET 200 can be reduced.

As described above, according to this second embodiment, the built-in pn junction diode infrequently operates. Accordingly, a MOSFET 200 is achieved in which the growth of the stacking fault in the silicon carbide layer 10 can be prevented and reliability can be improved. In addition, according to this second embodiment, a MOSFET 200 having a low on-state resistance is achieved.

First Modified Example

Figure 11:
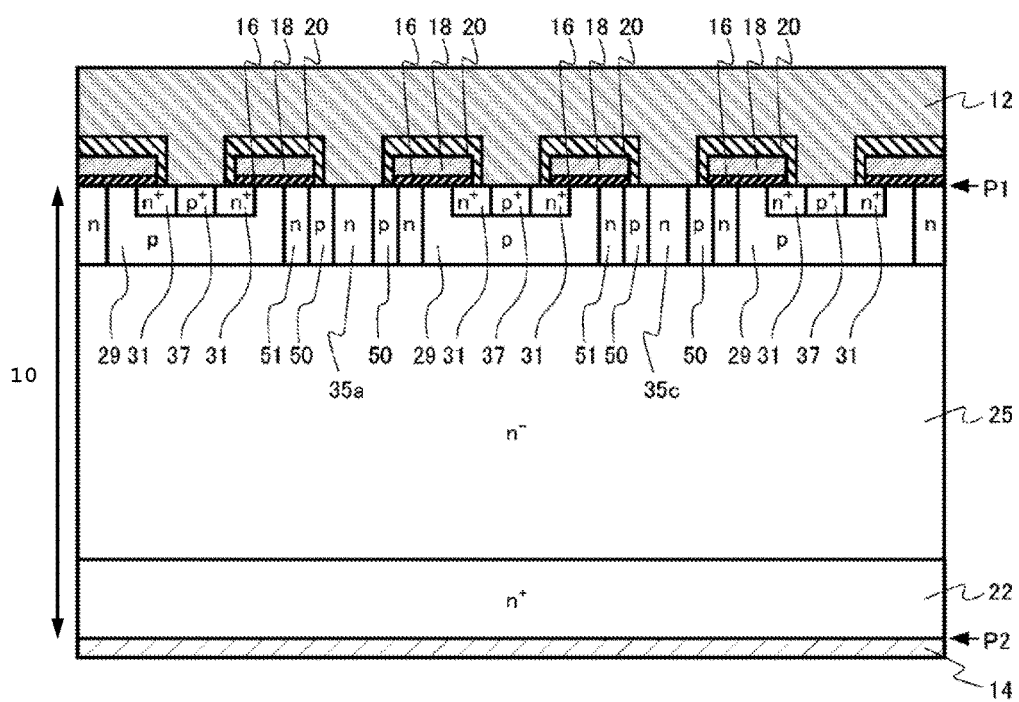
FIG. 11 is a schematic cross-sectional view of a semiconductor device according to a first modified example of the second embodiment.

FIG. 11 is a schematic cross-sectional view of a semiconductor device according to a first modified example of the second embodiment. The cross-section depicted in FIG. 11 corresponds to the cross-section illustrated in FIG. 10.

The semiconductor device of the first modified example differs from that of the second embodiment in that a p-type region 50 is provided between the first SBD cathode region 35a and the body region 29 and an n-type region 51 is provided between the p-type region 50 and the body region 29. For example, the p-type region 50 is formed simultaneously with the body region 29.

The semiconductor device of the first modified example has substantially the same operations and effects as the MOSFET 200. In addition, the p-type region 50 is provided, and thus it is possible to relax an electric field at a contact edge of the SBD and to reduce a leakage current through the SBD. The leakage current can be reduced by a depletion layer extending from the p-type region 50 when the MOSFET is turned off. Furthermore, the n-type region 51 is provided, and thus the on-state resistance of the first modified example can be reduced as compared to the MOSFET 200.

Second Modified Example

Figure 12:
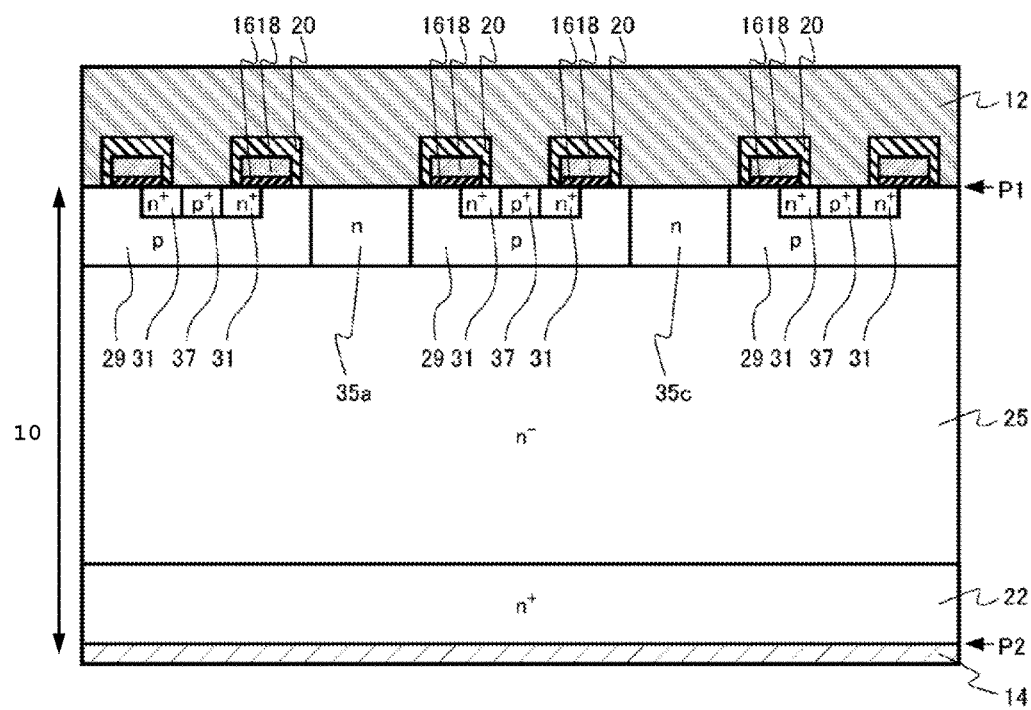
FIG. 12 is a schematic cross-sectional view of a semiconductor device according to a second modified example of the second embodiment.

FIG. 12 is a schematic cross-sectional view of a semiconductor device according to a second modified example of the second embodiment. This cross-section corresponds to the cross-section illustrated in FIG. 10.

The semiconductor device of the second modified example differs from that of the second embodiment in that an end of the gate electrode 18 on the SBD side is located on the body region 29. The body region 29 and the first SBD cathode region 35a are in contact with each other.

The semiconductor device of the second modified example has substantially the same operations and effects as MOSFET 200. However, since the ratio of the occupied area of the SBDs can be made larger, the occurrence of the forward operation of the pn junction diode can be further prevented.

Third Embodiment

The semiconductor device according to this third embodiment differs from the semiconductor device according to the second embodiment in that a layout pattern is provided in which hexagon-based units are repeatedly arranged.

Figure 13:
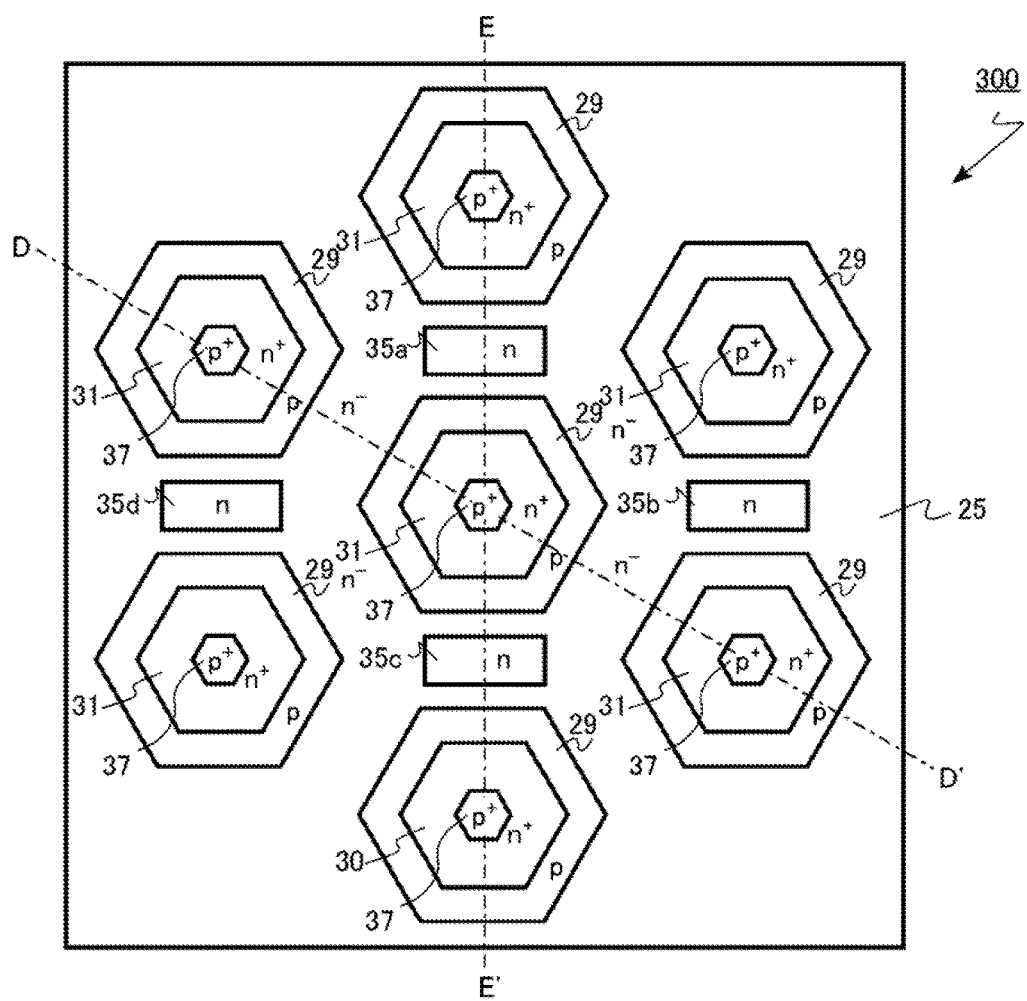
FIG. 13 is a schematic top view of a semiconductor device according to a third embodiment.
Figure 14:
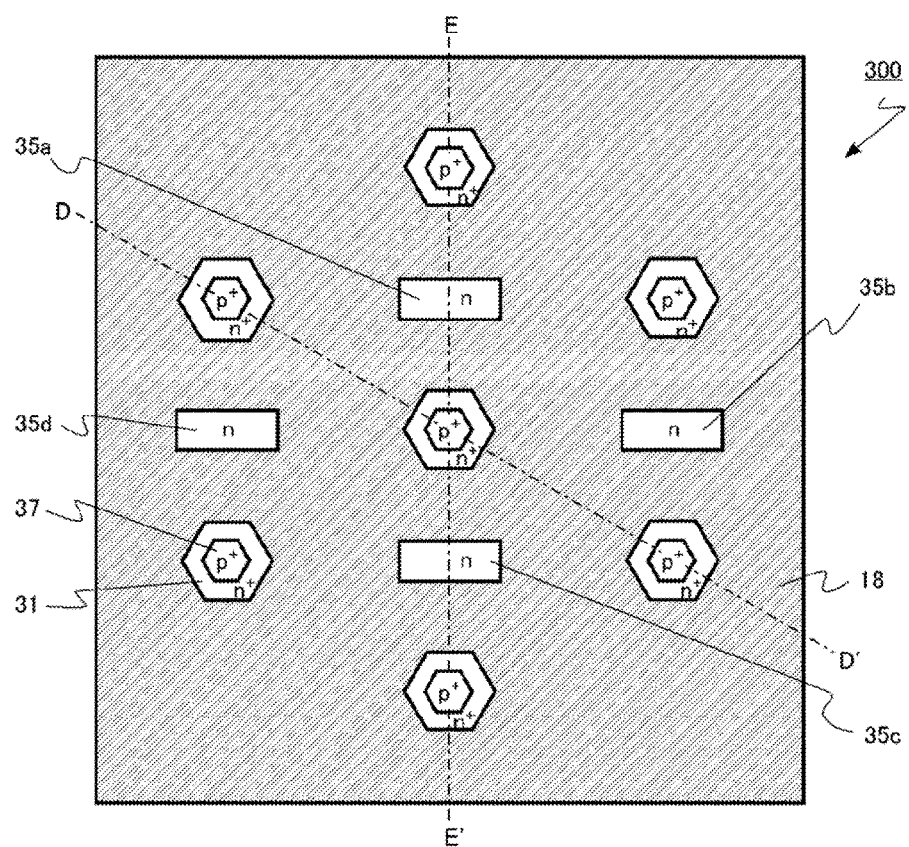
FIG. 14 is a schematic top view of the semiconductor device according to the third embodiment.
Figure 15:
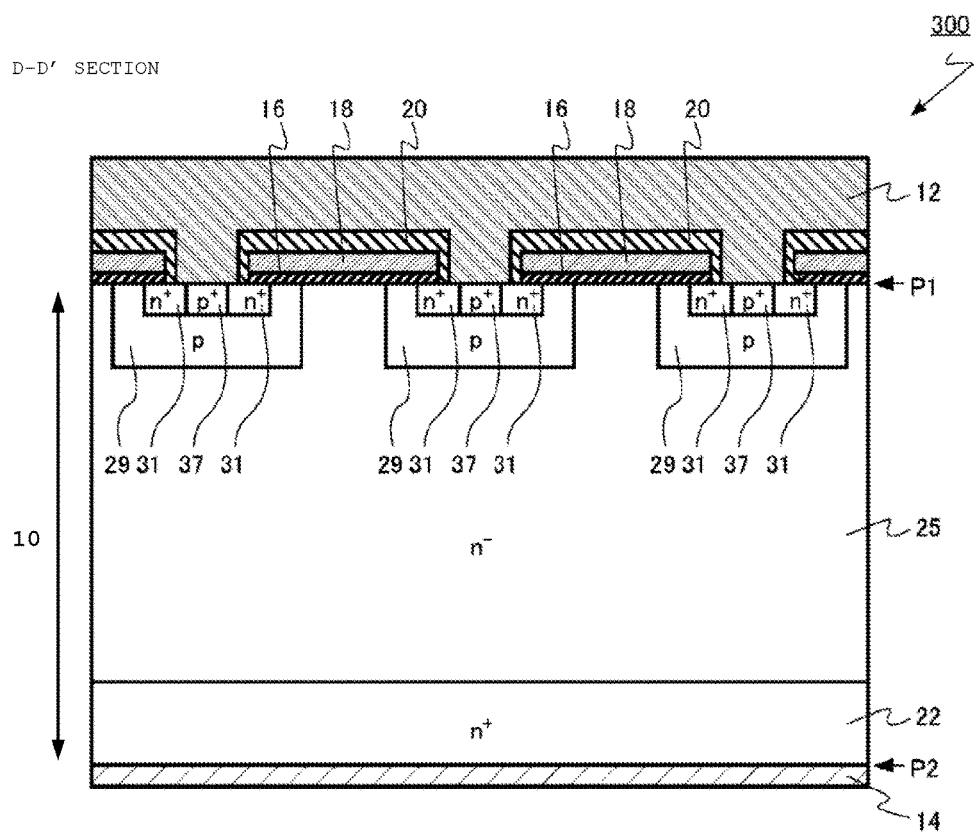
FIG. 15 is a schematic cross-sectional view of the semiconductor device according to the third embodiment.
Figure 16:
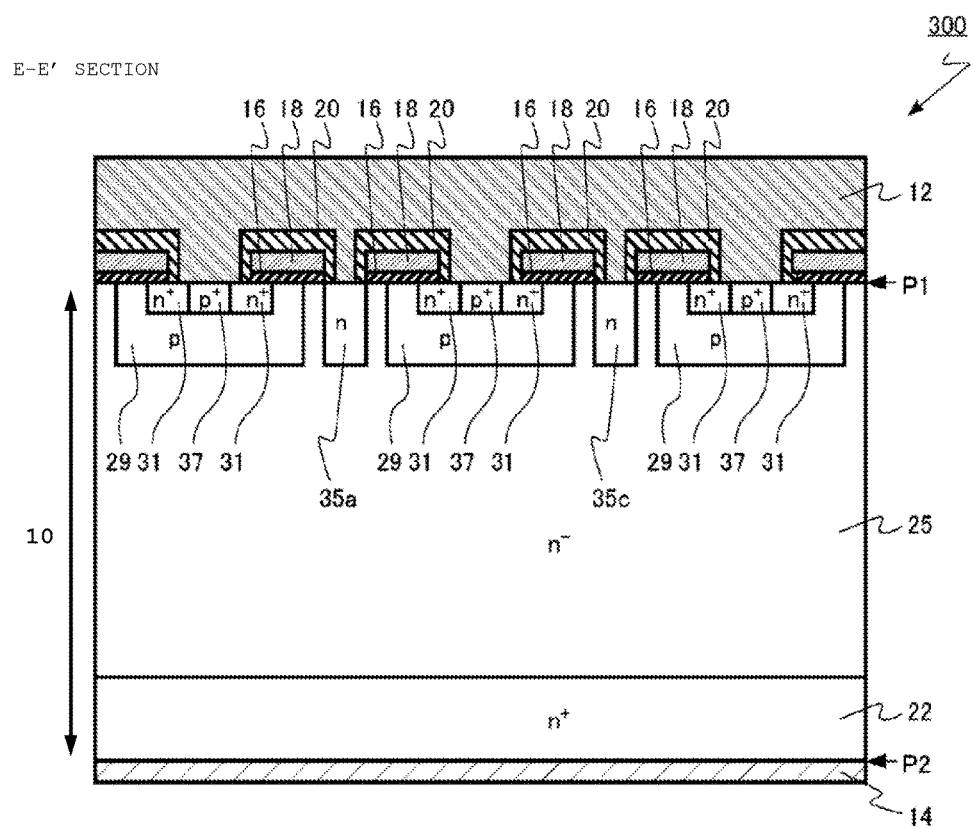
FIG. 16 is a schematic cross-sectional view of the semiconductor device according to the third embodiment.

FIGS. 13 and 14 are schematic top views of the semiconductor device according to this embodiment. FIGS. 15 and 16 are schematic cross-sectional views of the semiconductor device according to this embodiment. FIG. 13 is a diagram illustrating impurity region patterns on a surface (e.g., P1) of a silicon carbide layer. FIG. 14 is a diagram in which gate electrode patterns are superimposed on the impurity region patterns illustrated in FIG. 13. FIG. 15 is a cross-sectional view taken along line D-D' in FIGS. 13 and 14. FIG. 16 is a cross-sectional view taken along line E-E' in FIGS. 13 and 14.

The semiconductor device according to this third embodiment is a planar gate type vertical MOSFET 300 formed using silicon carbide. The MOSFET 300 according to this third embodiment is, for example, a double implantation MOSFET in which a body region and a source region are formed by ion implantation. In addition, the semiconductor device according to this third embodiment includes an SBD as a built-in diode.

Hereinafter, a case where a first conductivity type is an n-type and a second conductivity type is a p-type will be described as an example. The MOSFET 300 is a vertical n-channel type MOSFET using electrons as a carrier.

The MOSFET 300 includes a silicon carbide layer 10, a source electrode 12 (first electrode), a drain electrode 14 (second electrode), a gate insulation layer 16, a gate electrode 18, and an interlayer insulating layer 20.

The silicon carbide layer 10 includes an n$^+$ type drain region 22, an n$^-$ type drift region 25 (first silicon carbide region), a p-type body region 29 (sixth silicon carbide region), an n$^+$ type source region 31 (seventh silicon carbide region), an n-type first SBD cathode region 35a (second silicon carbide region), an n-type second SBD cathode region 35b (third silicon carbide region), an n-type third SBD cathode region 35c (fourth silicon carbide region), an n-type fourth SBD cathode region 35d (fifth silicon carbide region), and a p$^+$ type body contact region 37 (eighth silicon carbide region).

Similarly to the MOSFET 200, the MOSFET 300 has four SBDs that are arranged around a body region 29. Accordingly, the electron current flows into the four SBDs arranged around the body region 29, and thus a density of the electron current flowing through the bottom of the body region 29 increases. Therefore, the voltage drop due to the entering of the electrostatic potential increases in the drift region 25 at the bottom of the body region 29.

Therefore, at the bottom of the body region 29, the voltage applied between the body region 29 and the drift region 25 drops. Accordingly, the voltage applied between the body region 29 and the drift region 25 will be unlikely to exceed the forward voltage (Vf) of the pn junction diode at the bottom of the body region 29, and forward operation of the pn junction diode will be unlikely to occur.

In the MOSFET 300, the entire surface of the hexagonal body region 29 functions as a channel region. Accordingly, it is possible to prevent the decrease in on-state resistance per unit area by arrangement of the SBDs. Thus, a MOSFET 300 having a low on-resistance can be realized.

According to the MOSFET 300, the forward current is unlikely to flow through the pn junction diode, which performs bipolar operation. Therefore, it is possible to prevent the growth of the stacking fault in the silicon carbide layer 10 due to carrier recombination. In addition, according to this third embodiment, a MOSFET 300 having the low on-state resistance can be achieved.

Fourth Embodiment

The semiconductor device according to this fourth embodiment differs from the semiconductor device according to the second embodiment in that a layout pattern is provided in which rectangular units are repeatedly arranged.

Figure 17:
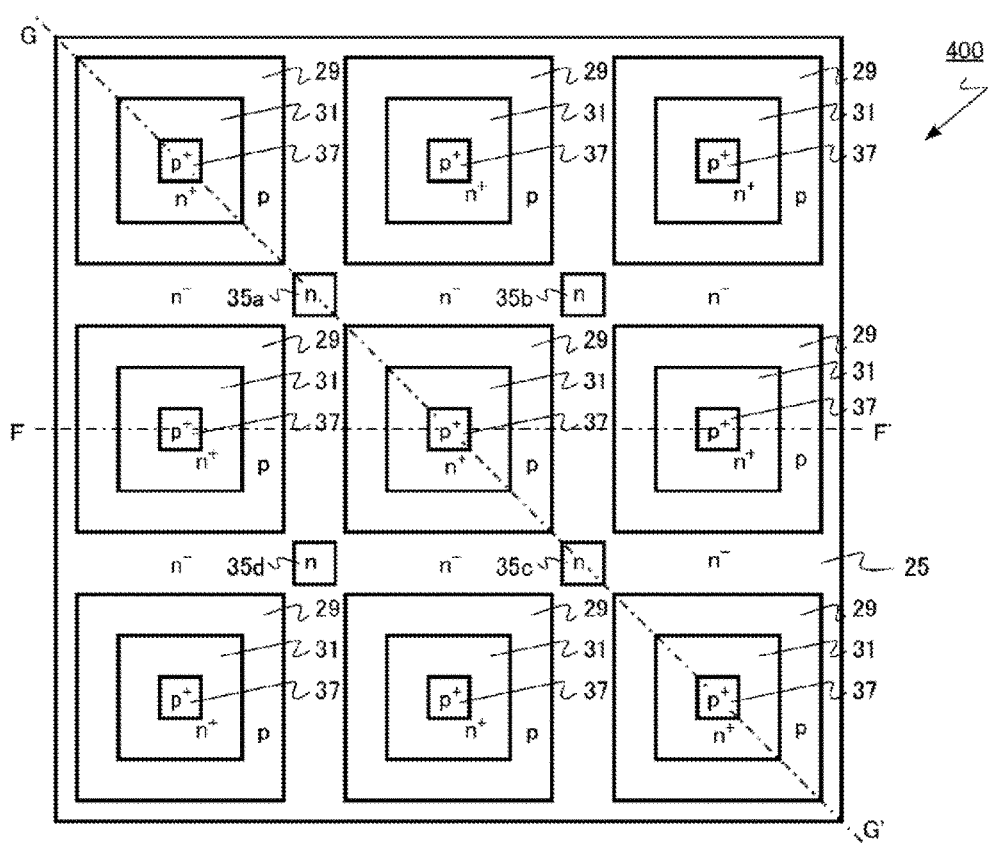
FIG. 17 is a schematic top view of a semiconductor device according to a fourth embodiment.
Figure 18:
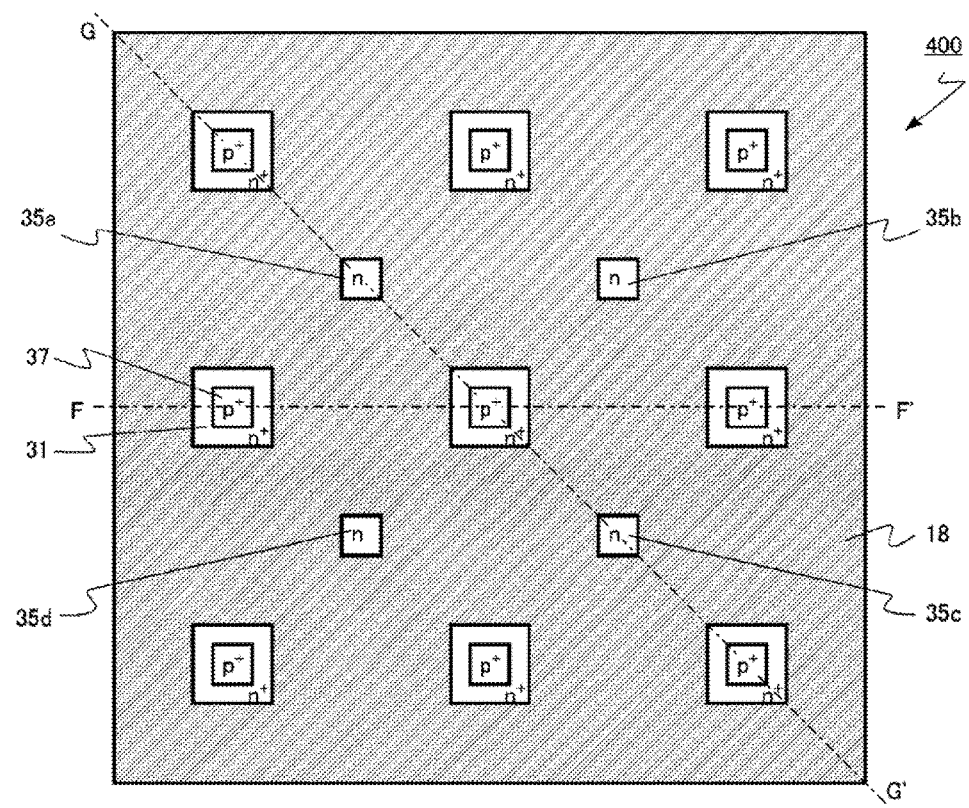
FIG. 18 is a schematic top view of the semiconductor device according to the fourth embodiment.
Figure 19:
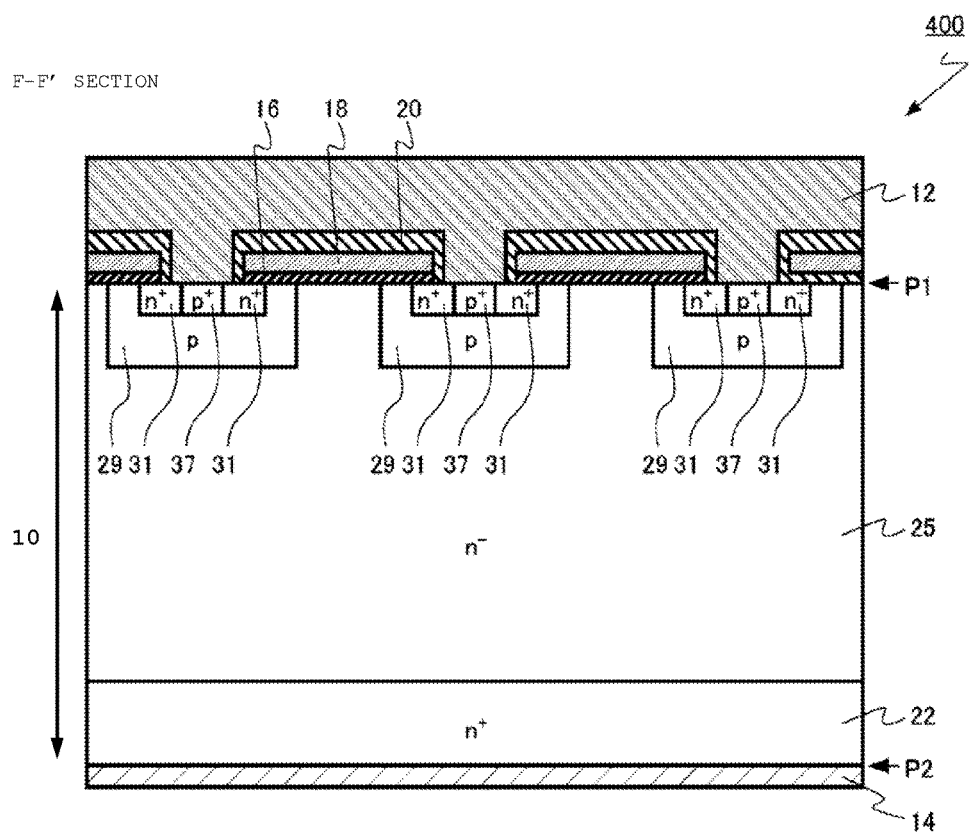
FIG. 19 is a schematic cross-sectional view of the semiconductor device according to the fourth embodiment.
Figure 20:
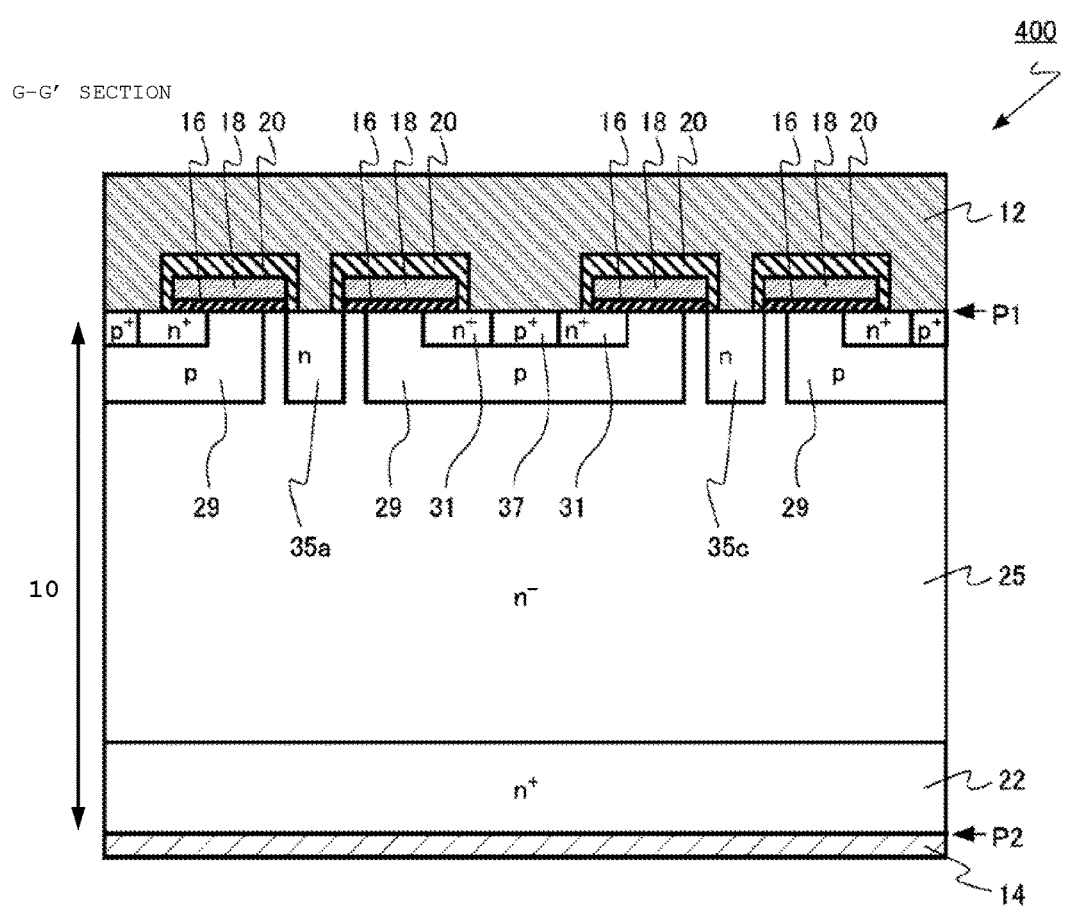
FIG. 20 is a schematic cross-sectional view of the semiconductor device according to the fourth embodiment.

FIGS. 17 and 18 are schematic top views of the semiconductor device according to this fourth embodiment. FIGS. 19 and 20 are schematic cross-sectional views of the semiconductor device according to this fourth embodiment. FIG. 17 is a diagram illustrating impurity region patterns on an upper surface (P1) of the silicon carbide layer. FIG. 18 is a diagram in which gate electrode patterns are superimposed on the impurity region patterns illustrated in FIG. 17. FIG. 19 is a cross-sectional view taken along line F-F' in FIGS. 17 and 18. FIG. 20 is a cross-sectional view taken along line G-G' in FIGS. 17 and 18.

The semiconductor device according to this fourth embodiment is a planar gate type vertical MOSFET 400 formed using silicon carbide. The MOSFET 400 according to this fourth embodiment is, for example, a double implantation MOSFET in which a body region and a source region are formed by ion implantation. In addition, the semiconductor device according to this fourth embodiment includes an SBD as a built-in diode.

Hereinafter, a case where a first conductivity type is an n-type and a second conductivity type is a p-type will be described as an example. The MOSFET 400 is a vertical n-channel type MOSFET using electrons as a carrier.

The MOSFET 400 includes a silicon carbide layer 10, a source electrode 12 (first electrode), a drain electrode 14 (second electrode), a gate insulation layer 16, a gate electrode 18, and an interlayer insulating layer 20.

The silicon carbide layer 10 includes an n$^+$ type drain region 22, an n$^-$ type drift region 25 (first silicon carbide region), a p-type body region 29 (sixth silicon carbide region), an n$^+$ type source region 31 (seventh silicon carbide region), an n-type first SBD cathode region 35a (second silicon carbide region), an n-type second SBD cathode region 35b (third silicon carbide region), an n-type third SBD cathode region 35c (fourth silicon carbide region), an n-type fourth SBD cathode region 35d (fifth silicon carbide region), and a p$^+$ type body contact region 37 (eighth silicon carbide region).

Similarly to the MOSFET 200 according to the second embodiment, the MOSFET 400 according to this fourth embodiment has four SBDs arranged around a body region 29. Accordingly, the electron current flows into the four SBDs arranged around the body region 29, and thus a density of the electron current flowing through the bottom of the body region 29 increases. Therefore, the voltage drop due to the entering of the electrostatic potential increases in the drift region 25 at the bottom of the body region 29.

Therefore, at the bottom of the body region 29, the voltage applied between the body region 29 and the drift region 25 drops. Accordingly, the voltage applied between the body region 29 and the drift region 25 is less likely to exceed the forward voltage (Vf) of the pn junction diode at the bottom of the body region 29, and the forward operation of the pn junction diode is less likely to occur.

According to the MOSFET 400 of this fourth embodiment, the entire surface of a square body region 29 functions as a channel region. Accordingly, it is possible to prevent the decrease in on-state resistance per unit area by the arrangement of the SBDs. Thus, a MOSFET 400 having a low on-state resistance can be realized.

According to the MOSFET 400 of this fourth embodiment, the forward current is unlikely to flow through the pn junction diode, which performs bipolar operation. Therefore, it is possible to prevent the growth of the stacking fault in the silicon carbide layer 10 due to carrier recombination. In addition, according to this fourth embodiment, a MOSFET 400 having the low on-resistance can be achieved.

In the first to fourth embodiments, the description is made with respect to the case where the crystal structure of the SiC material is 4H—SiC, as an example. However, the present disclosure is also applicable to devices using another crystal structure of SiC such as 6H—SiC, 3C—SiC, or the like. Further, the surface of the silicon carbide layer 10 may have planes other than the (0001) plane.

In the first to fourth embodiments, the description is made with respect to the case where the first conductivity type is the n-type and the second conductivity type is the p-type, as an example. However, the first conductivity type and the second conductivity type can also be the p-type and the n-type, respectively.

In the first to fourth embodiments, the aluminum (Al) is exemplified as the p-type impurity. However, boron (B) can be used as the p-type impurity. Furthermore, nitrogen (N) and phosphorus (P) are exemplified as the n-type impurity, but arsenic (As), antimony (Sb), or the like is also applicable.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a silicon carbide layer;
a first electrode on a first side of the silicon carbide layer;
a second electrode on a second side of the silicon carbide layer;
a gate electrode between the first electrode and the silicon carbide layer;
a first region of a first conductivity type in the silicon carbide layer, the first region being between the first electrode and the second electrode and between the gate electrode and the second electrode;
a second region of the first conductivity type in the silicon carbide layer, the second region being between the first electrode and the first region and having an impurity concentration of the first conductivity type that is higher than an impurity concentration of the first conductivity type of the first region;
a third region of a second conductivity type in the silicon carbide layer, the third region being between the first electrode and the second region;
a fourth region of the first conductivity type in the silicon carbide layer, the fourth region being between the first electrode and the third region;
a fifth region of the first conductivity type in the silicon carbide layer, the fifth region being between the gate electrode and the second region, the third region being between the fourth region and the fifth region;
a sixth region of the first conductivity type in the silicon carbide layer, the sixth region being between the first electrode and the second region and contacting the first electrode; and
a gate insulation layer between the gate electrode and the third region and between the gate electrode and the fifth region.

2. The semiconductor device according to claim 1, wherein the sixth region has an impurity concentration of the first conductivity type that is higher than the impurity concentration of the first conductivity type of the first region.

3. The semiconductor device according to claim 1, wherein the fifth region has an impurity concentration of the first conductivity type that is higher than the impurity concentration of the first conductivity type of the first region.

4. The semiconductor device according to claim 1, wherein the second region has an impurity concentration of the first conductivity type that is higher than an impurity concentration of the first conductivity type of the fifth region and an impurity concentration of the first conductivity type of the sixth region.

5. The semiconductor device according to claim 1, further comprising:
a seventh region of the second conductivity type in the silicon carbide layer, the seventh layer being between the sixth region and the fourth region and having an impurity concentration of the second conductivity type that is higher than an impurity concentration of the second conductivity of the third region.

6. The semiconductor device according to claim 1, wherein the first conductivity type is n-type and the second conductivity type is p-type.

7. The semiconductor device according to claim 1, wherein the third region, the fourth region, the fifth region, and the sixth region extend a stripe pattern along a first surface of the silicon carbide layer.

8. A semiconductor device, comprising:
a silicon carbide layer;
a first electrode on a first side of the silicon carbide layer;
a second electrode on a second side of the silicon carbide layer;
a gate electrode between the first electrode and the silicon carbide layer;
a first region of a first conductivity type in the silicon carbide layer, the first region being between the first electrode and the second electrode and between the gate electrode and the second electrode;
a second region of the first conductivity type in the silicon carbide layer, the second region being between the first electrode and the first region and contacting the first electrode;
a third region of the first conductivity type in the silicon carbide layer, the third region being between the first electrode and the first region and contacting the first electrode;
a fourth region of the first conductivity type in the silicon carbide layer, the third region being between the first electrode and the first region and contacting the first electrode;
a fifth region of the first conductivity type in the silicon carbide layer, the third region being between the first electrode and the first region and contacting the first electrode;
a sixth region of a second conductivity type in the silicon carbide layer, the sixth region being between the first electrode and the first region, between the second region and the fourth region, and between the third region and the fifth region;
a seventh region of the first conductivity type in the silicon carbide layer, the seventh region being between the first electrode and the sixth region; and
a gate insulation layer between the gate electrode and the first region and between the gate electrode and the sixth region, wherein
the second, third, fourth, and fifth regions are arrayed around the sixth region within a plane that is parallel to a surface of the silicon carbide layer.

9. The semiconductor device according to claim 8, wherein the second, third, fourth, and fifth regions each have an impurity concentration of the first conductivity type that is higher than an impurity concentration of the first conductivity type of the first region.

10. The semiconductor device according to claim 8, wherein the seventh region and the first electrode contact each other.

11. The semiconductor device according to claim 8, further comprising:
an eighth region of the second conductivity type in the silicon carbide layer, the eight region being between the first electrode and the sixth region and in contact with the first electrode, and having an impurity concentration of the second conductivity type that is higher than an impurity concentration of the second conductivity type of the sixth region.

12. The semiconductor device according to claim 8, wherein
the sixth region surrounds the seventh region within a plane parallel to the surface of the silicon carbide layer, and
the sixth and seventh region each have an octagonal shape at the surface of the silicon carbide layer.

13. The semiconductor device according to claim 8, wherein
- the sixth region surrounds the seventh region within a plane parallel to the surface of the silicon carbide layer, and
- the sixth and seventh region each have a hexagonal shape at the surface of the silicon carbide layer.

14. The semiconductor device according to claim 8, wherein
- the sixth region surrounds the seventh region within a plane parallel to the surface of the silicon carbide layer, and
- the sixth and seventh region each have a rectangular shape at the surface of the silicon carbide layer.

15. The semiconductor device according to claim 14, wherein the rectangular shape is a square shape.

16. The semiconductor device according to claim 8, wherein the first conductivity type is n-type.

17. A semiconductor device, comprising:
- a silicon carbide layer;
- a source electrode on a first side of the silicon carbide layer;
- a drain electrode on a second side of the silicon carbide layer;
- a plurality of gate electrodes at a surface of the silicon carbide layer on the first side of the silicon carbide layer;
- a drift region of a first conductivity type in the silicon carbide layer, the drift region being between the source electrode and the drain electrode in a first direction and between the gate electrode and the drain electrode in the first direction;
- a plurality of Schottky barrier diode (SBD) cathode regions having the first conductivity type and disposed in the silicon carbide layer, the plurality of SBD cathode regions being between the source electrode and the first region in the first direction and directly contacting the source electrode;
- a body region of a second conductivity type in the silicon carbide layer, the body region being between the source electrode and the drift region in the first direction;
- a source region of the first conductivity type in the silicon carbide layer, the source region being between the source electrode and the body region in the first direction and surrounding the body region within a plane that is parallel to the surface of the silicon carbide layer; and
- a gate insulation layer between the gate electrode and the surface of the silicon carbide layer, wherein
- the plurality of SBD cathode regions are arrayed around the body region within a plane that is parallel to the surface of the silicon carbide layer.

18. The semiconductor device according to claim 17, further comprising:
- a source contact region of the second conductivity type in the silicon carbide layer, the source contact region being between the source electrode and the body region in the first direction and in direct electrical contact with the source electrode, wherein
- the source region and the body region surround the source contact region within a plane that is parallel to the surface of the silicon carbide layer.

19. The semiconductor device according to claim 17, wherein each SBD cathode region in the plurality of SBD cathode regions is surrounded from the surface of the silicon carbide layer to a surface of the drift region by first region of the second conductivity type and a second region of the first conductivity type, the first region being directly adjacent to the SBD cathode region in a second direction crossing the first direction, and the second region being between SBD cathode region and the body region along the second direction.

20. The semiconductor device according to claim 17, wherein the body region and the source region each have a hexagonal shape at the surface of the silicon carbide layer.

* * * * *